United States Patent [19]

Rapp et al.

[11] Patent Number: 4,956,338

[45] Date of Patent: Sep. 11, 1990

[54] METHODS FOR FORMING COMPLEX OXIDATION REACTION PRODUCTS INCLUDING SUPERCONDUCTING ARTICLES

[75] Inventors: Robert A. Rapp, Columbus, Ohio; Andrew W. Urquhart, Newark; Alan S. Nagelberg; Marc S. Newkirk, Newark, all of Del.

[73] Assignee: Lanxide Technology Company, LP, Newark, Del.

[21] Appl. No.: 217,105

[22] Filed: Jul. 6, 1988

Related U.S. Application Data

[63] Continuation of Ser. No. 119,760, Nov. 12, 1987, abandoned, which is a continuation-in-part of Ser. No. 69,731, Jul. 6, 1987, abandoned.

[51] Int. Cl.$^5$ ................................................ C04B 35/00
[52] U.S. Cl. .......................................... 505/1; 501/127; 501/134; 501/137; 501/153; 264/65; 423/593; 423/598; 423/600; 423/604; 423/621; 423/635; 505/736; 505/737; 252/62.9
[58] Field of Search ............... 501/127, 128, 134, 135, 501/137, 138, 139, 136, 153; 264/65; 423/593, 598, 608, 600, 604, 621, 635; 252/520, 521, 62.9; 505/736, 737, 725

[56] References Cited

U.S. PATENT DOCUMENTS

| | | | |
|---|---|---|---|
| 2,741,822 | 4/1956 | Udy | 25/157 |
| 3,255,027 | 6/1966 | Talsma | 264/65 |
| 3,296,002 | 1/1967 | Hare | 501/80 |
| 3,298,842 | 1/1967 | Suefert | 501/127 |
| 3,419,404 | 12/1968 | Mao | 501/98 |
| 3,421,863 | 1/1969 | Bawa | 501/128 |
| 3,437,468 | 4/1967 | Suefert | 75/235 |
| 3,441,517 | 4/1969 | Brauer et al. | 501/152 X |
| 3,473,938 | 10/1969 | Oberlin | 264/65 |
| 3,473,987 | 10/1969 | Sowards | 501/119 |
| 3,538,231 | 11/1970 | Newkirk et al. | 373/117 |
| 3,789,096 | 1/1974 | Church | 264/60 |
| 3,864,154 | 2/1975 | Gazza et al. | 29/123 |
| 3,973,977 | 8/1976 | Wilson | 501/120 |
| 4,713,360 | 12/1987 | Newkirk et al. | 501/128 |
| 4,851,325 | 7/1989 | Newkirk et al. | 501/127 |

FOREIGN PATENT DOCUMENTS

| | | |
|---|---|---|
| 0116809 | 8/1984 | European Pat. Off. |
| 0155831 | 9/1985 | European Pat. Off. |
| 0169067 | 1/1986 | European Pat. Off. |
| 0193292 | 3/1986 | European Pat. Off. |
| 0245192 | 11/1987 | European Pat. Off. |

*Primary Examiner*—Karl Group
*Attorney, Agent, or Firm*—Mark G. Mortenson; Michael K. Boyer

[57] ABSTRACT

A complex oxidation reaction product of two or more metals in an oxidized state is formed by positioning a suitable precursor metal adjacent to a permeable mass of a metal-containing compound in an oxidizing atmosphere and heating the assembly to form a body of molten precursor metal. The molten metal infiltrates the permeable mass and reacts therewith and with the oxidizing atmosphere to form a complex oxidation reaction product. Methods for determining the shape of the resulting article are described. The disclosed methods can be used to form superconducting perovskites.

47 Claims, 3 Drawing Sheets

METHODS FOR FORMING COMPLEX OXIDATION REACTION PRODUCTS INCLUDING SUPERCONDUCTING ARTICLES

CROSS-REFERENCE TO RELATED APPLICATIONS

This is a continuation of co-pending U.S. application Ser. No. 119,760 filed on Nov. 12, 1987, now abandoned, which is a continuation-in-part of commonly owned and copending U.S. Pat. application Ser. No. 069,731 filed Jul. 6, 1987, now abandoned in the name of Robert A. Rapp, et al. and entitled "Methods for Forming Complex Oxidation Reaction Products".

BACKGROUND OF THE INVENTION

1. Field of the Invention

The present invention broadly relates to novel methods for making complex oxidation reaction products such as perovskite bodies, including methods for making shaped complex oxidation reaction products. This invention can be used to make superconducting articles.

2. Background and Commonly Owned Patent Applications

Compounds such as ceramics are conventionally formed by a variety of methods. These methods involve the following general steps: (1) preparation of material in powder form; (2) grinding or milling of powders to obtain very fine particles; (3) formation of the powders into a body having the desired geometry, such as by uniaxial pressing, isostatic pressing, injection molding, tape casting, and slipcasting (with allowance for shrinkage during subsequent processing); (4) densification of the body by heating it at an elevated temperature such that the individual powder particles merge together to form a coherent structure (either without the application of pressure, or through the application of external pressure either uniaxially or isostatically); and (5) finishing frequently by diamond grinding, as required. Finishing operations are often difficult and expensive to perform, and, in some cases, much of the expense of conventional shaped ceramics is attributable to the cost of finishing operations.

The assignee of the present application has recently discovered new methods for forming ceramics by directed oxidation of a suitable bulk precursor metal. These methods are disclosed generically in copending and Commonly Owned U.S. Pat. application Ser. No. 818,943, filed Jan. 15, 1986, now U.S. Pat. No. 4,713,360, issued on Dec. 15, 1987, in the name of Marc S. Newkirk et al., and entitled "Novel Ceramic Materials and Methods for Making the Same". This application discloses a novel method for producing a self-supporting ceramic body by oxidation of a precursor molten metal or parent metal to form an oxidation reaction product. More specifically, the parent metal is heated to an elevated temperature above its melting point but below the melting point of the oxidation reaction product in order to form a body of molten parent metal which reacts upon contact with a vapor-phase oxidant to form the oxidation reaction product. The oxidation reaction product, or at least a portion thereof which is in contact with and extends between the body of molten parent metal and the oxidant, is maintained at the elevated temperature, and molten metal is drawn through the polycrystalline oxidation reaction product and towards the oxidant, and the transported molten metal forms oxidation reaction product upon contact with the oxidant. As the process continues, additional metal is transported through the polycrystalline oxidation reaction product thereby continually growing a ceramic structure of interconnected crystallites. Usually, the resulting ceramic body will contain therein inclusions of non-oxidized constituents of the parent metal drawn through the polycrystalline material and solidifed therein as the ceramic body is cooled after termination of the growth process. As explained in this Commonly Owned Patent Application, resultant novel ceramic materials are produced by the oxidation reaction between a parent metal and a vapor-phase oxidant, i.e., a vaporized or normally gaseous material, which provides an oxidizing atmosphere. In the case of an oxide as the oxidation reaction product, oxygen or gas mixtures containing oxygen (including air) are suitable oxidants, with air usually being preferred for obvious reasons of economy. However, oxidation is used in its broad sense in the Commonly Owned Patent Application and in this application, and refers to the loss or sharing of electrons by a metal to an oxidant which may be one or more elements and/or compounds. Accordingly, elements other than oxygen may serve as the oxidant, e.g. nitrogen.

Commonly Owned Patent Application U.S. Ser. No. 819,397, filed Jan. 17, 1986, now U.S. Pat. No. 4,851,375, issued on Jul. 25, 1989, discloses related methods for forming composite ceramic bodies. As described in this application, a ceramic composite is formed by placing a permeable mass or aggregate of a substantially inert or nonreactive filler material adjacent to or in contact with the parent metal such that the growing oxidation reaction product of the parent metal infiltrates and embeds at least a portion of the filler material. The present metal is heated as described above, and the oxidation reaction of the parent metal and vapor-phase oxidant is continued for a time sufficient for the oxidation reaction product to grow through or infiltrate at least a portion of the filler material, thus producing a composite body having a ceramic matrix of oxidation reaction product embedding the filler material, such matrix also optionally containing one or more metallic constituents.

Commonly Owned Patent Application U.S. Ser. No. 338,471, which is a continuation of U.S. Pat. application Ser. No. 861,025, filed May 8, 1986, discloses particularly effective methods in which the filler is formed into a preform with a shape corresponding to the desired geometry of the final composite product. The preform may be prepared by any of a wide range of conventional ceramic body formation methods (such as uniaxial pressing, isostatic pressing, slipcasting, sedimentation casting, tape casting, injection molding, etc.) depending largely on the characteristics of the filler. Initial binding of the particles prior to infiltration may be obtained through partial sintering or by use of various organic or inorganic binder materials which do not interfere with the process or contribute undesirable by-products to the finished material. The preform is manufactured to have sufficient shape integrity and green strength, and should be permeable to the growth of oxidation reaction product, preferably having a porosity of between about 5 and 90% by volume and more preferably between about 25 to 75% by volume. Also, an admixture of filler materials and mesh sizes may be used. The preform is then contacted with molten parent metal on one or more of its surfaces for a time sufficient to complete growth and infiltration of the preform to its surface boundaries.

As disclosed in Commonly Owned Patent Application U.S. Ser. No. 861,024, filed May 8, 1986, now allowed a barrier means may be used in conjunction with the filler material or preform to inhibit growth or development of the oxidation reaction product beyond the barrier. Suitable barrier means may be any material, compound, element, composition, or the like, which, under the process conditions of this invention, maintains some integrity, is not volatile, and preferably is permeable to the vapor-phase oxidant while being capable of locally inhibiting, poisoning, stopping, interfering with, preventing, or the like, continued growth of oxidation reaction product. Suitable barriers for use with aluminum parent metal and oxygen as the oxidant include calcium sulfate (plaster of paris), calcium silicate, and Portland cement, and mixtures thereof, which typically are applied as a slurry or paste to the surface of the mass of filler material. These barrier means also may include a suitable combustible or volatile material that is eliminated on heating, or a material which decomposes on heating, in order to increase the porosity and permeability of the barrier means. Still further, the barrier means may include a suitable refractory particulate to reduce any possible shrinkage or cracking which otherwise may occur during the process. Such a particulate having substantially the same coefficient of expansion as that of the filler bed or preform is especially desirable. For example, if the preform comprises alumina and the resulting ceramic comprises alumina, the barrier may be admixed with alumina particulate, desirably having a mesh size of about 20–1000, but may be still finer. Other suitable barriers include refractory ceramics or metal sheaths which are open on at least one end to permit a vapor-phase oxidant to permeate the bed and contact the molten parent metal. As a result of using a preform, especially in combination with a barrier means, a net shape is achieved, thus minimizing or eliminating expensive final machining, grinding or finishing operations.

Commonly Owned Patent Applications U.S. Ser. No. 823,542, filed Jan. 27, 1986, now U.S. Pat. No. 4,828,785, issued May 9, 1989, and U.S. Ser. No. 896,157, filed Aug. 13, 1986, now allowed disclose methods for reliably producing cavity-containing ceramic bodies of a size and thickness which are difficult or impossible to duplicate with previously available technology. Briefly, the inventions therein described involve embedding a shaped parent metal precursor in a conformable filler, and infiltrating the filler with a ceramic matrix obtained by oxidation of the parent metal to form a polycrystalline oxidation reaction product of said parent metal with an oxidant and, optionally, one or more metallic constituents. More particularly, in practicing the invention, the parent metal is shaped to provide a pattern, and then is emplaced in or surrounded by a conformable filler which inversely replicates the geometry of the shaped parent metal. In this method, the filler (1) is permeable to the oxidant when required as in the case where the oxidant is a vapor-phase oxidant and, in any case, is permeable to infiltration by the developing oxidation reaction product; (2) has sufficient conformability over the heat-up temperature interval to accommodate the differential thermal expansion between the filler and the parent metal plus any melting-point volume change of the metal; and (3) when required, at least in a support zone thereof enveloping the pattern, is intrinsically self-bonding, whereby said filler has sufficient cohesive strength to retain the inversely replicated geometry with the bed upon migration of the parent metal as described below. The surrounded or emplaced shaped parent metal is heated to a temperature region above its melting point but below the melting point of the oxidation reaction product to form a molten parent metal. The molten parent metal is reacted in that temperature region or interval with the oxidant to form the oxidation reaction product. At least a portion of the oxidation reaction product is maintained in that temperature region and in contact with and between the body of molten metal and the oxidant, whereby molten metal is progressively drawn from the body of molten metal through the oxidation reaction product, concurrently forming the cavity as oxidation reaction product continues to form within the bed of filler at the interface between the oxidant and previously formed oxidation reaction product. This reaction is continued in that temperature region for a time sufficient to at least partially embed the filler with the oxidation reaction product by growth of the latter to form the composite body having the aforesaid cavity therein. Finally, the resulting self-supporting composite body is separated from excess filler, if any.

The entire disclosures of each of the Commonly Owned Patent Applications identified above are incorporated herein by reference.

SUMMARY OF THE INVENTION

Generally, this invention is based upon the discovery that the oxidation of a suitable bulk metal source as the precursor (hereinafter referred to as the "parent metal source") with vapor-phase oxidant can be directed to infiltrate and react with a permeable mass or bedding comprising one or more metal-containing compounds to form a complex oxidation reaction product of two or more metals in an oxidation state. Under the process conditions, the molten parent metal source oxidizes outwardly from its initial surface (i.e., the surface exposed to the vapor-phase oxidant) towards the vapor-phase oxidant and infiltrates the bedding by migrating through its own reaction product, thereby producing the complex oxidation reaction product by reactive infiltration. The complex oxidation reaction product is then recovered.

The term "complex oxidation reaction product" means one or more compounds each containing two or more metals in an oxidized state, regardless of the crystalline structure or stoichiometry or of the nature of the chemical bonding involved, and is not intended to be limited to oxides, per se.

The bedding or aggregate of metal-containing compound or compounds is positioned adjacent to the parent metal source in the assumed path of the oxidation reaction product growth therefrom. The complex oxidation reaction product can grow into the bedding by reaction of the parent metal source. Thus, no external forces are required which might damage or disturb the arrangement of the bedding and no awkward and costly high temperature, high pressure processes and facilities are required to create the complex oxidation reaction product.

In accordance with the process, the parent metal source is heated to a temperature region or interval above its melting point, thereby forming a body of molten parent metal source which is reacted with the vapor-phase oxidant and the metal-containing compound of the bedding to form the complex oxidation reaction product without reduction to elemental metal of the metal component of the metal-containing compound. At this temperature or within this temperature range, molten parent metal source is drawn or transported through the complex oxidation reaction product towards the vapor-phase oxidant and towards the adjacent metal-containing compound to sustain the continued formation of complex oxidation reaction product. The complex oxidation reaction product comprises an oxide of the parent metal source and the metal or metals included in the metal-containing compound of the bedding, and optionally has therein inclusions of nonoxidized constituents of the parent metal source. As used herein, the term "parent metal source" is intended to include elemental parent metal or alloyed parent metal which can be oxidized and parent-metal-containing compounds which can be further oxidized.

In one embodiment the complex oxidation reaction product comprises a perovskite or a modified perovskite. The term "perovskite" as used herein is intended to include modified perovskites. For example, the parent metal source can comprise copper or a copper-containing compound and the bedding can comprise a rare earth oxide material such as lanthanum oxide, or yttrium oxide, and mixtures thereof. In another embodiment, an additional reactive metal oxide such as an alkaline earth metal oxide (e.g. barium oxide) is admixed in or incorporated in the oxide bedding material. Upon the reactive infiltration of the parent metal source, a perovskite of modified or altered structure is formed comprising an oxide of the parent metal source, the rare earth metal, and the alkaline earth metal.

The terms "rare earth" and "rare earth metal" are intended to include yttrium, lanthanum, and the elements with atomic numbers 58 through 71.

Other embodiments of this invention form other complex oxidation reaction products such as barium titanate and complex oxides of lead, titanium, and zirconium in an oxidized state.

The methods of this invention can be used to form shaped articles by properly adapting the methods described in the above-identified Commonly Owned Patent Applications. The bedding, which may, for example, include the materials described above, can be preformed to the desired final shape (allowing for dimensional changes in processing) with binders or other techniques as described in Application Ser. No. 861,025. In still other embodiments, an inert filler as reinforcing agent may be admixed with the bedding or preform, which is subsequently embedded by the complex oxidation reaction product. In yet another aspect of the invention, it may be desirable to post-treat the recovered product, particularly where the reaction is not complete or the reaction product is inhomogeneous or disordered, by heating the recovered product in the appropriate temperature region to homogenize or order or otherwise transform the product. Barrier means such as those described in Commonly Owned Patent Application 861,024 may be used to define an outer surface of the article. Similarly, the inverse shape replication techniques described in Commonly Owned Patent Applications 823,542 and 896,157 can be adapted to produce articles with internal cavities.

The products of the present invention generally are adaptable or fabricated, such as by machining, polishing, grinding, etc., for use as articles of commerce which, as used herein, are intended to include, without limitation, industrial, structural and technical ceramic bodies for applications where electrical, wear, thermal, structural, or other features or properties are important or beneficial; and it is not intended to include recycle or waste materials such as might be produced as unwanted by-products in the processing of molten metal.

A number of perovskites and modified perovskites have recently been found to exhibit superconducting properties at unusually high temperatures, and it has been shown that the methods of this invention can be used to form superconducting perovskites, as described in Example 3 below. It is expected that the methods of this invention will be useful in forming shaped perovskite articles as well as superconductors, including shaped superconducting articles.

DETAILED DESCRIPTION OF CERTAIN PRESENTLY PREFERRED EMBODIMENTS

Figure 1:
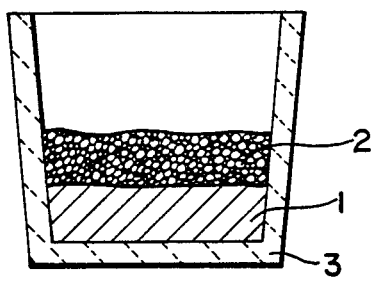
FIG. 1 is a cross-sectional view of a crucible containing materials suitable for use in a first embodiment of the method of this invention.
Figure 3:
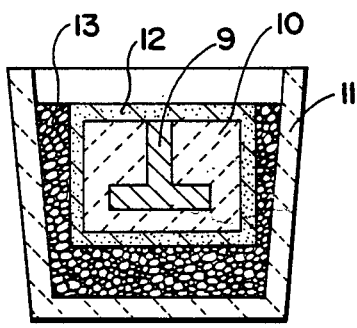
FIG. 3 is a cross-sectional view of a crucible containing materials suitable for use in a third embodiment of the method of this invention.

In the preferred embodiments of the present invention, the parent metal source and a permeable mass or bedding comprising a suitable metal-containing compound or compounds are positioned adjacent to each other and oriented with respect to each other so that oxidation of the parent metal source and formation, or at least partial formation, of the complex oxidation reaction product will be in a direction towards the bedding. This positioning and orientation of the parent metal source and bedding with respect to each other may be accomplished as illustrated in FIG. 1 by placing a body of the parent metal source 1 beneath a bedding 2 of particulate metal-containing compound in a crucible 3, or as shown in FIG. 3 by positioning one or more bodies of parent metal source 9 within, on or adjacent to a bedding 10 or other assembly of a metal-containing compound. The metal-containing compound may comprise, for example, an ingot, powder or other particulate, such powders typically having a mesh size from about 100 to 1000 or finer, and preferably at least about 200 because finer particle sizes tend to facilitate the reaction. The assembly is, in any case, arranged so that a direction of growth of the complex oxidation reaction product will be towards the bedding to allow for the continued reactive infiltration of the parent metal source with at least a portion of the bedding.

The parent metal source 1 is heated in the presence of a vapor-phase oxidant to a temperature above its melting point but below the melting point of the complex oxidation reaction product to form a body of molten parent metal source to permit infiltration and reaction of the molten parent metal source into the bedding 2 with the vapor-phase oxidant and the metal-containing compound to form the complex oxidation reaction product without reduction of the metal component of the metal-containing compound to elemental metal. The molten parent metal source is progressively drawn through the complex oxidation reaction product towards the vapor-phase oxidant and towards and into the adjacent permeable mass so that oxidation reaction product continues to form within the permeable mass, and the resulting complex oxidation reaction product is then recovered.

It should be understood that applicants are not bound by the mechanism of the reaction, and there is no attempt in explaining the mechanism or sequence of occurrence of reaction and infiltration, which may differ depending largely on the starting materials and process conditions. In some cases, reaction, or partial reaction, may precede infiltration or may occur during infiltration, and the invention as described and claimed is intended to cover the process regardless of the mechanism.

The choice of starting materials can vary widely, depending on the desired characteristics of the resulting complex oxidation reaction product. For example, a complex oxide of copper and at least one other metal in an oxidized state can be obtained by using a copper source such as elemental copper, cuprous oxide, and mixtures thereof, as the parent metal source and a suitable metal-containing compound, such as yttrium oxide, lanthanum oxide, barium oxide, and mixtures thereof, as the bedding. Perovskites and modified perovskites can be obtained in this manner. Where desired, the copper can be alloyed with a noble metal, such as silver, at about 5 to 20 weight percent, which remains segregated and unoxidized in the reaction product. This noble metal constituent could contribute to the properties of this end product. Silver or gold, for example, would contribute to the electrical properties of the product. As another example, barium titanate can be obtained by using titanium as the parent metal source and barium oxide as the bedding. Similarly, a complex oxide of lead, titanium, and zirconium in an oxidized state can be obtained by using a lead source as the parent metal source and a permeable admixture of oxides of titanium and zirconium as the bedding.

The bedding can comprise either a loose or bonded array or arrangement of materials, which array has interstices, openings, intervening spaces, or the like, to render it permeable to the vapor-phase oxidant and to the complex oxidation reaction product growth. Further, the bedding may be homogeneous or heterogeneous, and it may include metal oxide material. As used herein and in the appended claims, the terms "metal-containing compound", "oxide", and "oxide material" are intended to mean one or more materials unless indicated otherwise by the context.

Although the present invention is hereinafter described with particular emphasis on copper as the parent metal source, this reference is for exemplary purposes only, and it is to be understood that other metals such as lead, titanium, and aluminum also can be employed which meet the criteria of the invention.

In the example of copper as the parent metal source, oxide material as the permeable mass, and a perovskite as the resulting complex oxidation reaction product, the copper is placed in a crucible or other refractory container with the metal surface exposed to an adjacent or surrounding mass of a suitable permeable oxide material in said container and in the presence of a vapor-phase oxidant (typically an oxygen-containing gas such as air at ambient atmospheric pressure). The resulting assembly is then heated within a furnace to elevate the temperature above the melting point of copper, typically between about 1080° C. to about 1450° C., or more preferably between about 1100° C. to about 1250° C.

The continued high temperature exposure of the parent metal source to the oxygen-containing gas allows the continued oxidation of parent metal source to form a perovskite reaction product layer of increasing thickness which comprises oxides of both the parent metal source and the metal included in the oxide bedding material, without reduction of the metal component of the oxide bedding material to elemental metal. This growing perovskite reaction product progressively impregnates the permeable adjacent bedding to form a perovskite mass which preferably is interconnected in at least one direction. The growing perovskite continues to form provided sufficient air (or oxygen-containing gas) interchange is allowed in the furnace. Interchange of oxygen-containing gas, in the case of air, can be conveniently provided by vents in the furnace. Growth of the perovskite continues until at least one of the following occurs: (1) substantially all of the parent metal source is consumed; (2) the oxygen-containing atmosphere is replaced by non-oxidizing atmosphere, depleted of oxygen, or evacuated; or (3) the reaction temperature is altered to be substantially outside the reaction envelope, e.g., below the melting point of the parent metal source. Usually, the temperature is reduced by lowering the furnace temperature, and then the material is removed from the furnace.

In some cases, it may be desirable to post-treat the recovered complex oxidation reaction product, particularly where there has been partial formation or incomplete reaction of the parent metal source, in order to homogenize, order or otherwise transform the product. This post-treatment is typically conducted at an elevated temperature within the region or interval of the reaction infiltration step, but not necessarily at the said temperature. In the case of copper as the parent metal source, post-treatment is desirable at a temperature of about 475° C., but this temperature can vary depending upon the other constituents of the product.

Examples of oxides useful in the invention, depending upon parent metal source, include rare earth oxides such as lanthanum oxide, yttrium oxide, and mixtures thereof. In certain embodiments, one or more additional reactive metal oxides can be incorporated in or admixed with the oxide material. Such additional reactive metal oxides preferably include alkaline earth metal oxides, most preferably barium oxide having a mesh size of 200 or finer. The composition of the permeable mass or bedding into which the perovskite reaction product is formed is selected to give the desired end-product upon reaction with the parent metal source and oxidant. The rare earth oxide and the additional reactive metal oxide may be of the same or different mesh sizes. The resulting perovskite, which is a modified or altered structure, comprises both the additional reactive metal oxide and the rare earth oxide with the oxidized copper in the crystalline structure of the perovskite.

When the process of this invention is used to form barium titanate, the parent metal source may be elemental titanium, the bedding may be formed of particulate barium oxide of mesh size of 200 or finer, and the reaction may be carried out in a furnace in the presence of air as described above at a temperature between about 1700° C. and 2000° C.

When the process of this invention is used to form a complex oxide of lead, titanium, and zirconium, the parent metal source may be elemental lead and the bedding may be formed of a mixture of particulate titanium oxide and zirconium oxide. The titanium oxide and zirconium oxide may be of the same or different mesh sizes, and the mesh size is preferably 200 or finer. The bedding may, for example, include from about 30% to 70% titanium oxide and from about 70% to 30% zirconium oxide (mole percents). The reaction may be carried out in a furnace in the presence of air at a temperature between about 325° C. and 800° C., or higher.

The bedding may comprise a shaped preform which is made in or formed into any predetermined or desired size and shape by any conventional method, such as slipcasting, injection molding, transfer molding, vacuum forming, or otherwise, by processing any suitable metal-containing compound of the type more specifically identified and described elsewhere herein. The preform is permeable to growth therein of the complex oxidation reaction product obtained from oxidation of the parent metal source and the vapor-phase oxidant. The preform has a surface boundary, and should retain sufficient shape integrity and green strength to provide dimensional fidelity despite being permeable enough to accommodate the growing complex oxidation reaction product. Where desired, an inert filler as a reinforcing agent may be admixed with the bedding, whether preshaped or not, and in any desired ratio so long as the inert filler does not interfere or impede the reaction infiltration process. Suitable inert fillers include, for example, particles, fibers, or whiskers of alumina or silicon carbide. The resulting reaction product infiltrates and embeds the inert filler, and both the filler and percent of the filler may be preselected to tailor the properties of the end-product.

The metal-containing compound from which the preform is made, such as powders or particulates, may be bonded together with any suitable binding agent, e.g., polyvinyl alcohol or the like, which does not interfere with the reactions of this invention, or leave undesirable residual by-products within the complex oxidation reaction product. Suitable particulates having a grit or mesh size of from about 10 to 1000 or finer, or an admixture of mesh sizes and types, for example, may be used. The particulates may be molded by known or conventional techniques as by forming a slurry of the particulate in an organic binder, pouring the slurry into a mold, and then letting the part set as by drying at an elevated temperature.

Figure 2:
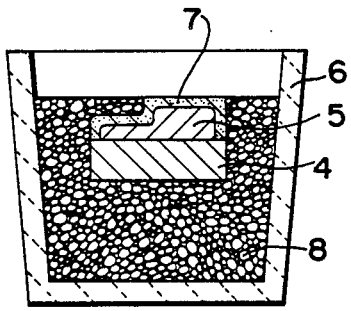
FIG. 2 is a cross-sectional view of a crucible containing materials suitable for use in a second embodiment of the method of this invention.

FIG. 2 shows one embodiment in which a layer of a parent metal source 4 is supported by an inert particulate 8 beneath a preform 5 of a metal-containing compound, and this lay-up is contained in crucible 6. For example, the parent metal source 4 is elemental copper and the metal-containing compound is a powder of oxide material such as one having a nominal composition of $YBa_2O_{3.5}$, which typically is mixed with a binder such as polyvinyl alcohol, methylcellulose, or the like, and pressed to form a shaped object. Other techniques described in Commonly Owned Patent Application No. 861,025 also can be used to fabricate the preform. Preferably, the binder should volatilize well below the melting point of the parent metal source 4 to prevent the binder from impeding formation of the complex oxidation reaction product.

As shown in FIG. 2, the outer surface of the preform 5 can be covered with a layer of a gas-permeable barrier material that inhibits and prevents formation of the complex oxidation reaction product beyond the defined surface. In this way, the outer surfaces of the resulting body can be defined with considerable precision to achieve a shaped article of high fidelity. In Commonly Owned Patent Application Ser. No. 861,024, a wide range of barrier materials is disclosed, but the particular barrier material useful in the practice of this invention would depend upon the starting materials and process conditions.

In this embodiment, the assembly of FIG. 2 is placed in an oven in a static air atmosphere and then heated to a temperature in the range of 1100° C. to 1300° C. for a sufficient time to allow the molten parent metal source 4 to infiltrate and react with the preform 5 to the barrier material 7. The resulting body has an outer surface which conforms closely to the shape of the preform 5.

In another embodiment of the invention such as shown in FIG. 3, the parent metal source or a portion thereof is emplaced within or placed in conforming engagement with a bedding. The bedding comprises at least one metal-containing compound and may optionally also comprise one or more additional metal-containing compounds as described above. A substitution non-metallic element such as fluorine also could be introduced into the bedding as a compound of the element, e.g. by the substitution of $BaF_2$ for a fraction of the BaO. Alternatively, fluorine can be incorporated into the end product by using fluorine gas in the oxidant, such as fluorine in combination with an oxygen-containing gas. The bedding conforms to the shape of the parent metal source with the result (as explained in the above-described Commonly Owned Patent Applications Ser. Nos. 823,542 and 896,157) that the resulting complex oxidation reaction product has formed therein a negative pattern of one or more cavities which inversely replicates the shape or geometry of the parent metal. The parent metal source may comprise one or more pieces, or it may be a simple cylinder, bar, ingot, or the like, or it may be suitably shaped by any appropriate means, for example, a parent metal bar, billet or ingot may be suitably machined, cast, molded, extruded or otherwise shaped to provide a shaped parent metal source body. The parent metal source body may thus have one or more grooves, bores, recesses, lands, bosses, flanges, screw threads and the like formed therein. It may also or alternatively have one or more collars, bushings, discs, bars, or the like assembled thereto to provide any desired configuration.

FIG. 3 shows an illustrative embodiment in which the parent metal source is formed as a copper pin 9 which is buried in a conforming bed 10 that in this embodiment comprises selected rare earth oxides as described above. The bed 10 is encased in a barrier layer 12 similar to that described above, and the entire assembly is surrounded by an inert particulate 13 contained in a crucible 11. When the lay-up is heated in an oven in an oxygen-containing atmosphere as described above, the copper forms a complex oxidation reaction product with the oxide bedding material, leaving a product with a defined internal cavity in the volume previously occupied by the copper pin 9 and a well-defined external surface at the interface with the barrier layer 12. The resulting shaped complex oxidation reaction product optionally may include one or more non-oxidized constituents of the parent metal source, or voids, or both.

As pointed out above, a number of perovskites have been found to exhibit superconducting properties at high temperatures, and by properly choosing the parent metal source, the rare earth oxide, the alkaline earth oxide and the additives, the methods of this invention can be used to form perovskite superconductors. It is anticipated that the methods of this invention can be used to form shaped superconductor articles of perovskites and modified perovskites. In addition, to the extent that other superconductors comprising complex oxidation reaction products other than perovskites are formed, it is anticipated that the methods of this invention can be used to form such other superconductors, including shaped articles formed of such other superconductors.

The following Examples illustrate the practice of certain aspects of the invention.

EXAMPLE 1

A weighed mixture of 15 grams of $La(NO_3)_3 \cdot 6H_2O$ and 2.25 grams of $Ba(NO_3)_2$ was combined in water to dissolve and disperse the phases. The resulting aqueous solution was initially dried on a hot plate utilizing a Teflon®-coated stirring bar to maximize chemical uniformity. Final drying was achieved by placing the mixture in a drying oven at 90° C. overnight.

The dried mixture was placed in an $Al_2O_3$ crucible and fired at 900° C. for 12 hours to convert the nitrates to oxides and to form a (Ba.La) oxide powder having a theoretical formula of $(Ba_{0.2}La_{0.8})_2O_{2.8}$.

As shown in FIG. 1, two distinct layers of material were then placed in a high form crucible 3 of $Al_2O_3$. The lower layer 1 was a weighed quantity of 14.7 grams of copper shot approximately 1 mm in diameter. The copper shot was of 99.9% purity. The upper layer 2 was a weighed quantity of 2.4 grams of the (Ba.La) oxide powder described above. The (Ba.La) oxide powder was formed of particle sizes predominantly between 100 mesh and 325 mesh.

The crucible with the copper shot and the (Ba.La) oxide powder was then placed in an oven at ambient temperature with a static air atmosphere. The temperature in the oven was then raised at the rate of 400° C./hr to a temperature of 1100° C., which was maintained for six hours. Then the oven temperature was lowered at the rate of 400° C./hr to room temperature.

The crucible with the copper shot and the (Ba.La) oxide weighed 73 grams prior to heating and 75 grams after heating. This weight change amounts to 11% of the combined weight of the copper shot and the (Ba.La) oxide and is attributable to the oxidation of the copper shot. Visual inspection indicated that the reaction and infiltration occurred into the bed of (La.Ba) oxide powders.

EXAMPLE 2

A weighed mixture of 12.83 grams of $Y_2O_3$ and 19.8 grams of $Ba(NO_3)_2$ was processed as described in Example 1 to form a (Ba.Y) oxide powder having a theoretical formula of $Y_{0.6}Ba_{0.4}O_{1.3}$.

Two distinct layers of material were then placed in a crucible of $Al_2O_3$. The lower layer was a weighed quantity of 0.21 grams of copper shot and copper powder. The copper shot was identical to that of Example 1 and the copper powder was formed of $-100$ mesh particles of the same purity. The upper layer was a weighed quantity of 1.3 grams of the (Ba.Y) oxide powder described above. The (Ba.Y) oxide powder was formed of particles sized predominantly between 100 mesh and 300 mesh.

The crucible with the copper and (Ba.Y) oxide layers was then fired using the procedure of Example 1. The resulting product exhibited a weight change of $-0.3\%$ (probably indicative of some loss of adsorbed moisture and particles from the powder bed), and the interior of the crucible below the (Y.Ba) oxides was darkened.

Subsequent semi-quantitative energy dispersive spectroscopy using a TRACOR-NORTHERN TN5500 Energy Dispersive X-ray System determined that the relative percentages of Y, Ba, and Cu in one phase of the composite was 45:21:34, within measurement limits of 40:27:33, the theoretical relative percentages for a perovskite reported elsewhere to have a high superconducting transition temperature. An x-ray diffraction analysis using a Siemens D500 X-ray Diffractometer showed the presence of a perovskite lattice.

EXAMPLE 3

A weighed mixture of 100 grams of $Ba(NO_3)_2$ and 73.3 grams of $Y(NO_3)_3 \cdot 6H_2O$ was semi-dissolved in distilled water. The resulting water mixture was initially dried on a stirring hot plate using agitation as heat was added to remove excess water. After about three hours a thick slurry was formed. While still hot the slurry was poured into eight alumina crucibles. The partially filled crucibles were then placed in a drying oven at a temperature of about 125° C. for about 18 hours. The crucibles were then removed from the drying oven and placed in a high temperature oven with a static air atmosphere for final drying and firing. The oven started at room temperature and the temperature T in the oven was controlled as follows:

1. T raised at 40° C./hr to 150° C.;
2. T held at 150° C. for 2 hours;
3. T raised at 40° C./hr to 400° C.
4. T held at 400° C. for 1 hour;
5. T raised at 200° C./hr to 1100° C.
6. T held at 1100° C. for 12 hours;
7. T lowered at 200° C./hr to room temperature The resulting material was then ball milled to form a (Ba.Y) oxide powder having a Ba to Y ratio of 2:1.

As shown in FIG. 1, two distinct layers of material were then placed in a crucible 3 of $Al_2O_3$. The lower layer 1 was a weighed quantity of 1.37 grams of copper metal powder of 99.9% purity. The upper layer 2 was a weighed quantity of 3.01 grams of the (Ba.Y) oxide powder described in the preceding paragraph. The (Ba.Y) oxide powder was formed of particle sizes predominantly between 100 mesh and 325 mesh.

The crucible with the copper powder and the (Ba.Y) oxide powder was then placed in an oven at room temperature with a static air atmosphere. The temperature in the oven was then raised at the rate of 200° C./hour to 1100° C., which was maintained for 6 hours, and then decreased at 200° C./hour to 925° C. and held at that temperature for 48 hours. The oven temperature was then lowered at the rate of 50° C./hour to room temperature.

The crucible with the copper powder and the (Ba.Y) oxide powder weighed 11.007 grams prior to heating and 11.077 grams after heating. This weight change results from the combined effects of $NO_2$ evolution and oxidation of the copper during the above thermal treatment. Visual inspection indicated that the reaction and infiltration occurred into the bed of (Ba.Y) oxide powder, thereby forming a tabular-like dark material.

Figure 4:
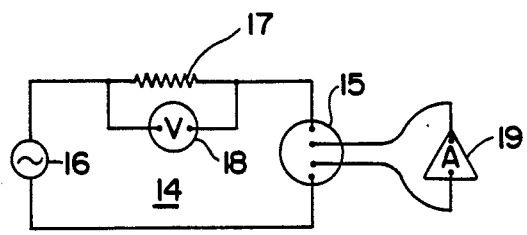
FIG. 4 is a schematic diagram of a test apparatus used to measure electrical resistance of samples produced in accordance with Example 3 below.

The composite of this example has been found to exhibit superconducting properties at temperatures below about 92° K. (the transition temperature). Specifically, the electrical resistance of a sample of the composite was measured, using the measuring apparatus described in *Rev. Sci. Instrum.*; Vol. 58, No. 9, pp. 1568-1569 (Sept., 1987), which is incorporated herein by reference. The essentials of the equivalent circuit 14 of this apparatus are shown in FIG. 4, in which the composite sample is shown at 15. The equivalent circuit 14 includes a reference AC current source 16 which is connected in series with a 121.5 ohm reference resistor 17 and the composite sample 15. The voltage drop $V_{STD}$ across the resistor 17 is measured with a voltmeter 18 and the voltage drop $V_{SAMP}$ across the composite sample 15 is measured with a differential input lock-in amplifier 19. Typically, the reference AC current is selected to have a frequency of about 100 Hz and a magnitude of 1 mA.

The resistance $R_{SAMP}$ of the composite sample 15 is equal to $V_{samp}/I$, where I is the reference AC current. The current I is equal to $V_{STD}/121.5$, and therefore $R_{SAMP}$ can be calculated from $V_{STD}$ and $V_{SAMP}$ as follows:

$$R_{samp} = \frac{V_{SAMP}}{V_{STD}} (121.5)$$

Figure 5:
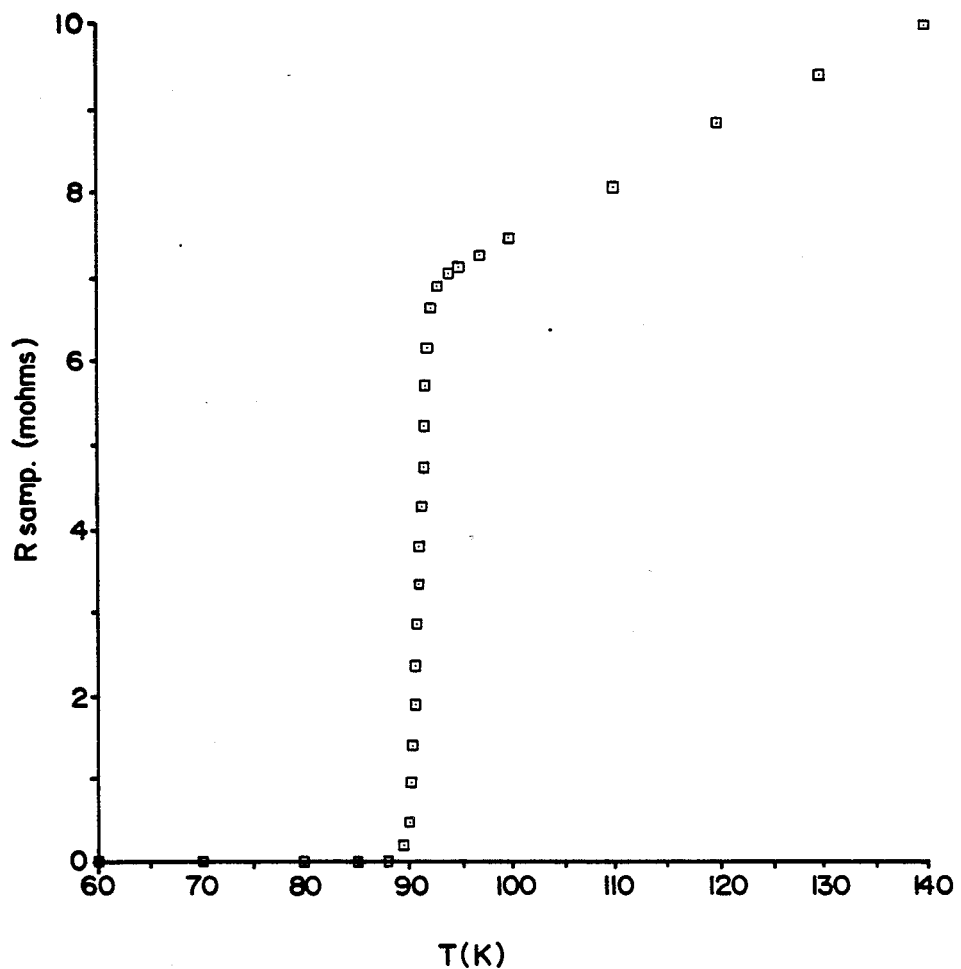
FIGS. 5 and 6 are graphs of electrical resistance versus temperature of a sample produced in accordance with Example 3 below.
Figure 6:
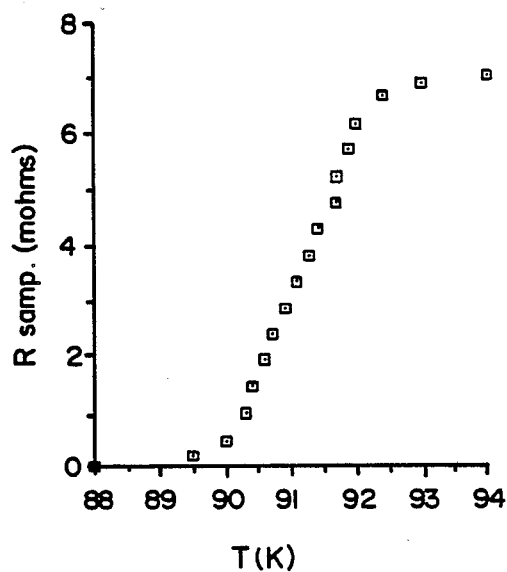

This relation was used to determine the resistance of the composite sample 15 as a function of temperature. The results are plotted in FIGS. 5 and 6, which plot $R_{SAMP}$ (in milliohms) versus temperature (in degrees Kelvin). FIG. 5 shows the superconducting properties of the composite sample 15 at temperatures below about 92° K. FIG. 6 shows the rapid decrease in electrical resistance at the transition temperature.

Figure 7:
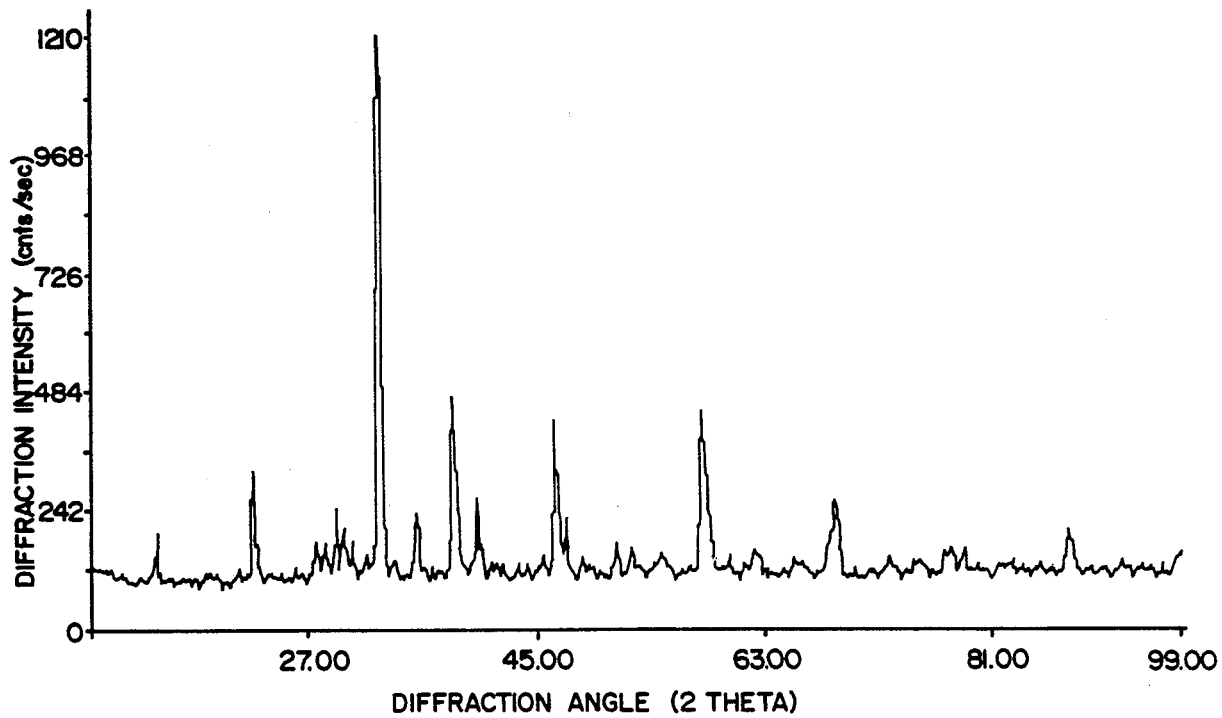
FIG. 7 is an x-ray diffraction pattern on a sample made in accordance with Example 3 below.

The material of this Example 3 was examined by x-ray diffraction in a Siemens D500 Diffractometer. The sample mount was scanned from 10°-100° at 2θ in 0.05° steps for one second intervals using monochromated CuKa radiation. From an interpretation of the x-ray diffraction pattern of the sample as shown in FIG. 7, it was determined that the composition comprised at least 90% by volume of the distorted perovskite known to act as the superconducting phase. Also, the position of the diffraction peaks shows that the composition comprised $YBa_2Cu_3O_{7-x}$, where, typically for superconducting compositions, "x" is less than about 0.2.

Although only a few exemplary embodiments of the invention have been described in detail above, those skilled in the art will readily appreciate that the present invention embraces many combinations and variations other than those exemplified.

What is claimed is:

1. A method for producing a complex oxidation reaction product of two or more metals in an oxidized state, which comprises:
   (a) positioning a parent metal source comprising at least one first metal of said two or more metals adjacent to a permeable mass comprising at least one metal-containing compound capable of reaction to form said complex oxidation reaction product in step (b) below, the metal component of said at least one metal-containing compound comprising at least a second of said two or more metals, and orienting said parent metal source and said permeable mass relative to each other so that formation of the complex oxidation reaction product will occur in a direction towards and into said permeable mass; and
   (b) heating said parent metal source in the presence of a vapor-phase oxidant to a temperature region above its melting point to form a body of molten parent metal to permit infiltration and reaction of the molten parent metal into said permeable mass and with said vapor-phase oxidant and said at least one metal-containing compound to form said complex oxidation reaction product, without reduction of the metal component of said at least one metal-containing compound to elemental metal, and progressively drawing the molten parent metal source through the complex oxidation reaction product towards said vapor-phase oxidant and towards and into the adjacent permeable mass so that fresh complex oxidation reaction product continues to form within the permeable mass; and
   (c) recovering the resulting complex oxidation reaction product.

2. The method of claim 1, wherein said complex oxidation reaction product comprises a complex oxide and said vapor-phase oxidant comprises an oxygen-containing gas.

3. The method of claim 2, wherein said complex oxide comprises a perovskite.

4. The method of claim 2 or claim 3, wherein said parent metal source comprises at least one metal selected from the group consisting of copper and aluminum.

5. The method of claim 2 or claim 3, wherein said parent metal source comprises copper.

6. The method of claim 2 or claim 3, wherein said at least one metal-containing compound comprises at least one member selected from the group consisting of oxides of lanthanum, yttrium, barium, and mixtures thereof.

7. The method of any of claims 1, 2 or 3, wherein said at least one metal-containing compound comprises at least one rare earth oxide and at least one other reactive metal oxide, and wherein said complex oxidation reaction product comprises an oxide of said parent metal source, reactive metal, and rare earth.

8. The method of claim 7, wherein said at least one reactive metal oxide comprises at least one alkaline earth metal oxide.

9. The method of claim 7, wherein said at least one rare earth oxide comprises yttrium oxide, wherein said at least one other reactive metal oxide comprises an oxide of barium, and wherein said complex oxidation reaction product comprises an oxide of said parent metal source, yttrium, and barium.

10. The method of any of claims 1, 2 or 3, wherein a substitution non-metallic element is incorporated into said permeable mass as a compound of the element.

11. The method of claim 10, wherein said substitution nonmetallic element comprises fluorine.

12. The method of any of claims 1, 2 or 3, wherein a substantially inert filler is incorporated into said permeable mass.

13. The method of any of claims 1, 2 or 3, wherein said parent metal source comprises a noble metal.

14. The method of claim 13, wherein said noble metal comprises silver or gold.

15. The method of claim 7, wherein said at least one rare earth oxide comprises lanthanum oxide, wherein said at least one other reactive metal oxide comprises an oxide of barium, and wherein said complex oxidation reaction comprises an oxide of said parent metal source, lanthanum, and barium.

16. The method of claim 2 or claim 3, wherein said at least one metal-containing compound comprises an oxide of at least one rare earth.

17. The method of any of claims 1, 2 or 3, wherein said permeable mass is shaped into a preform and wherein said infiltration and reaction into said preform produces an oxidation reaction product possessing the configuration of said preform.

18. The method of claim 1, further comprising defining a surface boundary of said permeable mass with a barrier means and continuing said infiltration and reaction towards said barrier means.

19. The method of claim 17, further comprising defining a surface boundary of said permeable mass with a gas permeable barrier means and continuing said infiltration and reaction towards said barrier means.

20. The method of claims 1, 2 or 3, wherein said parent metal source is configured as a pattern and said permeable mass is placed in conforming engagement with said pattern so that upon said infiltration and reaction said pattern is inversely replicated by said oxidation reaction product.

21. The method of claim 1, wherein said parent metal source comprises copper, wherein said complex oxidation reaction product comprises a perovskite, and wherein said complex oxidation reaction product exhibits superconducting properties.

22. The method of claim 21, wherein said at least one metal-containing compound comprises at least one material selected from the group consisting of oxides of lanthanum, yttrium, barium, and mixtures thereof.

23. The method of claim 21, wherein said at least one metal-containing compound comprises at least one rare earth oxide and at least one other reactive metal oxide, and wherein said complex oxidation reaction product comprises an oxide of said copper, reactive metal, and rare earth.

24. The method of claim 23, wherein said at least one other reactive metal oxide comprises one or more alkaline earth metal oxides.

25. The method of claim 23, wherein said at least one rare earth oxide comprises yttrium oxide, wherein said at least one other reactive metal oxide comprises an oxide of barium, and wherein said complex oxidation reaction product comprises an oxide of said copper, yttrium, and barium.

26. The method of claim 21, wherein said at least one metal-containing compound comprises an oxide of at least one rare earth.

27. The method of claim 21, wherein said permeable mass is shaped into a preform and wherein said infiltration and reaction into said preform produces an oxidation reaction product possessing the configuration of said preform.

28. The method of claim 21, further comprising defining a surface boundary of said permeable mass with a barrier means and continuing said infiltration and reaction towards said barrier means.

29. The method of claim 27, further comprising defining a surface boundary of said permeable mass with a gas permeable barrier means and continuing said infiltration and reaction towards said barrier means.

30. The method of claim 21, wherein said parent metal source is configured as a pattern and said permeable mass is placed in conforming engagement with said pattern so that upon said infiltration and reaction said pattern is inversely replicated by said oxidation reaction product.

31. A method for producing a ceramic body comprising a complex oxide of copper and at least one other metal in an oxidized state, which comprises:
 (a) positioning a copper source adjacent to a permeable mass comprising at least one metal-containing compound capable of reaction to form said complex oxide in step (b) below, and orienting said copper source and said permeable mass relative to each other so that formation of the complex oxide will occur in a direction towards and into said permeable mass; and
 (b) heating said copper source in the presence of an oxygen-containing gas to a temperature above its melting point to form a body of molten copper source to permit infiltration and reaction of the molten copper source into said permeable mass and with said oxygen-containing gas and said at least one metal-containing compound to form said complex oxide without reduction of the metal component of said at least one metal-containing compound to elemental metal, and progressively drawing the molten copper source through the complex oxide towards said oxygen-containing gas and towards and into the adjacent permeable mass so that the complex oxide continues to form within the permeable mass; and
 (c) recovering the resulting ceramic body.

32. The method of claim 31, wherein the copper source, said at least one metal-containing compound, and the oxygen-containing gas are selected such that the resulting ceramic body comprises a perovskite which exhibits superconducting properties.

33. The method of claim 32, wherein said copper source comprises at least one material selected from the group consisting of copper, cuprous oxide, and mixtures thereof.

34. The method of claim 33, wherein said oxygen-containing gas comprises air.

35. The method of any of claims 31, 32 or 33, wherein said at least one metal-containing compound comprises at least one material selected from the group consisting of yttrium oxide, lanthanum oxide, barium oxide, and mixtures thereof.

36. The method of any of claims 31, 32 or 33, wherein said at least one metal-containing compound comprises one or more rare earth oxides.

37. The method of any of claims 31, 32 or 33, wherein a noble metal is alloyed with said copper source.

38. The method of claim 37 wherein said noble metal comprises at least one metal selected from the group consisting of gold and silver.

39. The method of any of claims 31, 32 or 33, wherein a substitution non-metallic element is incorporated into said permeable mass as a compound of the element.

40. The method of claim 39, wherein said substitution non-metallic element comprises fluorine.

41. A method for producing a ceramic body comprising a complex oxide of lead, titanium, and zirconium in an oxidized state, which comprises:
 (a) positioning at least one parent metal source comprising lead adjacent to a permeable mass comprising oxides of titanium and zirconium capable of reaction to form said complex oxide in step (b) below, and orienting said at least one parent metal source and said permeable mass relative to each other so that formation of the complex oxide will occur in a direction towards and into said permeable mass; and (b) heating said at least one parent metal source in the presence of an oxygen-containing gas to a temperature above its melting point but below the melting point of the complex oxide to form a body of molten parent metal source to permit infiltration and reaction of the molten parent metal source into said permeable mass with said oxygen-containing gas and said mass to form said complex oxide without reduction of the titanium component and the zirconium component in said oxides to elemental titanium and zirconium, and progressively drawing the molten parent metal source through the complex oxide towards said oxygen-containing gas and towards and into the adjacent permeable mass so that the complex oxide continues to form within the permeable mass; and (c) recovering the resulting ceramic body.

42. A method for producing a ceramic body comprising barium titanate, which method comprises:

(a) positioning at least one parent metal source comprising titanium adjacent to a permeable mass of barium oxide and orienting said at least one parent metal source and said permeable mass relative to each other so that formation of the barium titanate will occur in a direction towards and into said permeable mass; and (b) heating said at least one parent metal source in the presence of an oxygen-containing gas to a temperature above its melting point to form a body of molten parent metal source to permit infiltration and reaction of the molten parent metal source into said permeable mass with said oxygen-containing gas and said barium oxide to form barium titanate without the reduction of the barium component in said barium oxide to elemental barium, and progressively drawing the molten parent metal source through the barium titanate towards said oxygen-containing gas and towards and into the adjacent permeable mass so that barium titanate contines to form within the permeable mass; and (c) recovering the resulting ceramic body.

43. The method of any of claims 18, 19, 28 or 29, wherein said infiltration and reaction occurs only up to said barrier means.

44. The method of claim 17, wherein a substantially inert filler is incorporated into said preform.

45. The method of any of claims 31, 41 or 42, wherein a substantially inert filler is incorporated into said permeable mass.

46. The method of any of claims 1, 31, 41 or 42, wherein a post-treatment step is conducted to modify the complex oxidation reaction product.

47. The method of claim 46, wherein said post-treatment step comprises subjecting the formed complex oxidation reaction product to an elevated temperature.

* * * * *